(12) United States Patent
Huang et al.

(10) Patent No.: US 7,005,339 B2
(45) Date of Patent: Feb. 28, 2006

(54) METHOD OF INTEGRATING HIGH VOLTAGE METAL OXIDE SEMICONDUCTOR DEVICES AND SUBMICRON METAL OXIDE SEMICONDUCTOR DEVICES

(75) Inventors: Ching-Chun Huang, Tai-Chung (TW); Ming-Hsien Huang, Hsin-Chu (TW); Rong-Ching Chen, Tai-Chung (TW); Jy-Hwang Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 106 days.

(21) Appl. No.: 10/707,444

(22) Filed: Dec. 15, 2003

(65) Prior Publication Data

US 2005/0130378 A1 Jun. 16, 2005

(51) Int. Cl.
*H01L 21/8238* (2006.01)

(52) U.S. Cl. .................... 438/221; 438/296; 438/427; 257/E27.064

(58) Field of Classification Search ............... 438/221, 438/223, 275, 296, 424, 427
See application file for complete search history.

(56) References Cited

U.S. PATENT DOCUMENTS

| 2001/0036705 A1 * | 11/2001 | Nishida et al. | 438/496 |
| 2004/0058508 A1 * | 3/2004 | Parat et al. | 438/424 |
| 2004/0147090 A1 * | 7/2004 | Kim et al. | 438/424 |
| 2005/0090049 A1 * | 4/2005 | Abadeer et al. | 438/197 |

\* cited by examiner

*Primary Examiner*—George Fourson
*Assistant Examiner*—Thanh V. Pham
(74) *Attorney, Agent, or Firm*—Winston Hsu

(57) ABSTRACT

The present invention provides a method of integrating at least one high voltage metal oxide semiconductor device and at least one Submicron metal oxide semiconductor device on a substrate. The method comprises: providing the substrate, forming a plurality of shallow trenches having different depths on a surface of the substrate, and forming a plurality of silicon oxide layers filling up the shallow trenches, and a top of each of the silicon oxide layers being in the shape of a mushroom.

25 Claims, 10 Drawing Sheets

METHOD OF INTEGRATING HIGH VOLTAGE METAL OXIDE SEMICONDUCTOR DEVICES AND SUBMICRON METAL OXIDE SEMICONDUCTOR DEVICES

BACKGROUND OF INVENTION

1. Field of the Invention

The present invention provides a method of making high voltage metal oxide semiconductor (HVMOS) devices and submicron metal oxide semiconductor (Submicron MOS) devices, and more particularity a method of integrating HVMOS devices and Submicron MOS devices with a shallow trench technology.

2. Description of the Prior Art

With the rapid growth of the integrated circuit (IC) market and the desire for highly integrated IC products, how to integrate HVMOS devices and Submicron MOS devices, and how to simultaneously form a large number of both HVMOS devices and Submicron MOS devices on a silicon wafer are important issues at the present time.

Figure 1:
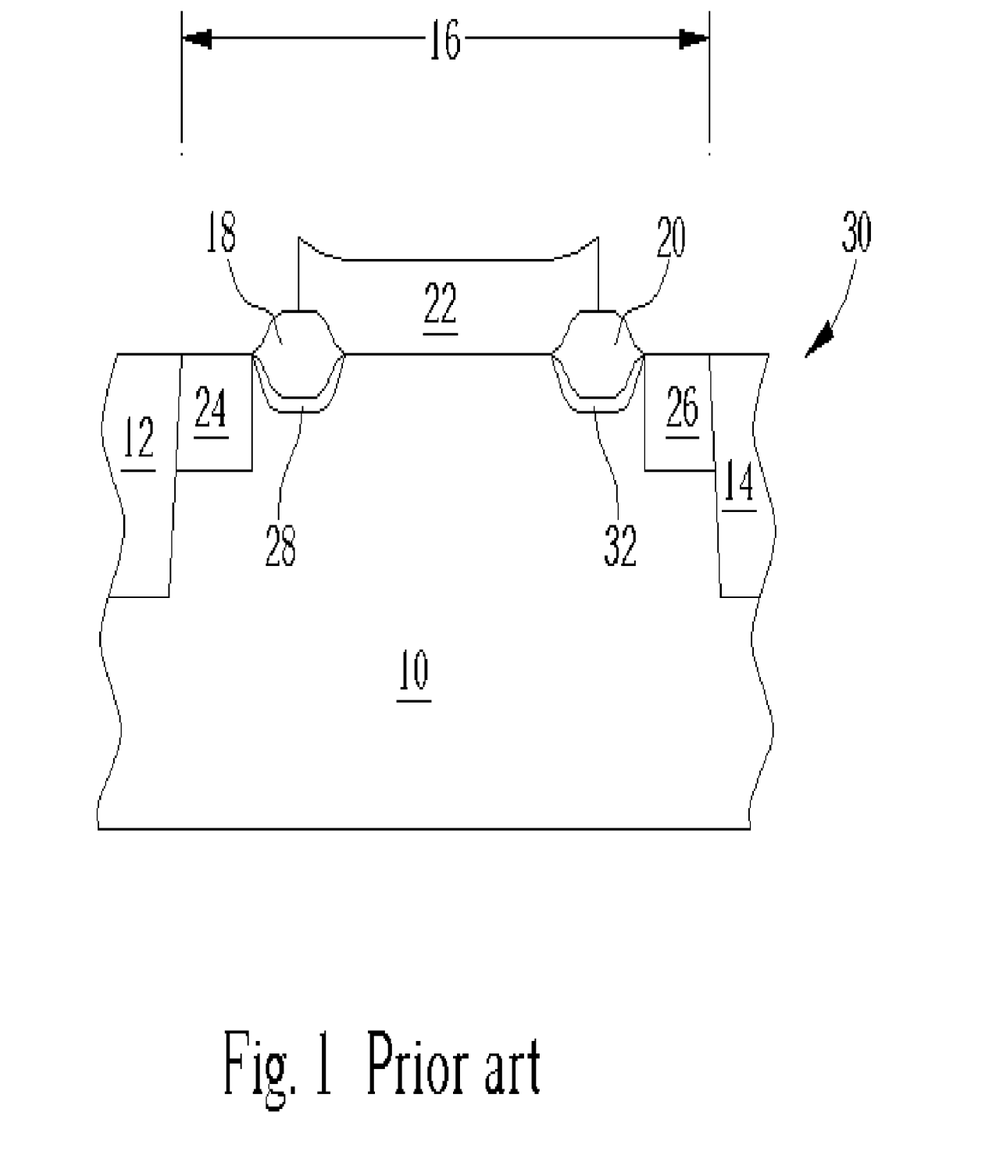
FIG. 1 is a cross-sectional diagram of an HVMOS device formed on a silicon substrate according to the prior art method.

Please refer to FIG. 1. FIG. 1 is a cross-sectional diagram of an HVMOS device 30 formed on a silicon substrate according to the prior art method. As shown in FIG. 1, the HVMOS device 30 is formed on a silicon substrate 10. A shallow trench process is performed first to form a plurality of shallow trenches 12,14 and to define at least one active region 16 isolated by the shallow trenches 12, 14 on the silicon substrate 10. Then, two not adjacent field oxide (FOX) layers 18,20 are formed on a surface of the active region 16. After that, a gate 22 is formed on the surface of the active region 16 between the two not adjacent field oxide layers 18,20, and a portion of the gate 22 covers the field oxide layers 18,20. A first ion implantation processes is thereafter performed to form two first ion implantation regions 24,26 on the surface of the active region 16 not covered by the gate 22 and the field oxide layers 18,20. A second ion implantation process is then performed to form two second ion implantation regions 28,32 underneath the field oxide layers 18,20. The first ion implantation regions 24,26, being used as double diffused drains (DDD), are taken as a source and a drain of the HVMOS device 30. The second ion implantation regions 28,32 are used as drift regions of the HVMOS device 30.

However, smaller feature size in integrated circuits is always a dominant factor in driving technology progress. As the feature size becomes small, the drift regions 28,32 of the HVMOS device 30 underneath the field oxide layers 18,20 become an issue since the internal stress generated by the field oxide layers 18, 20 and the bird beak encroaching the field oxide layers 18, 20 limit the minimum feature sizes of the drift regions 28,32 of the HVMOS device 30.

Figure 2:
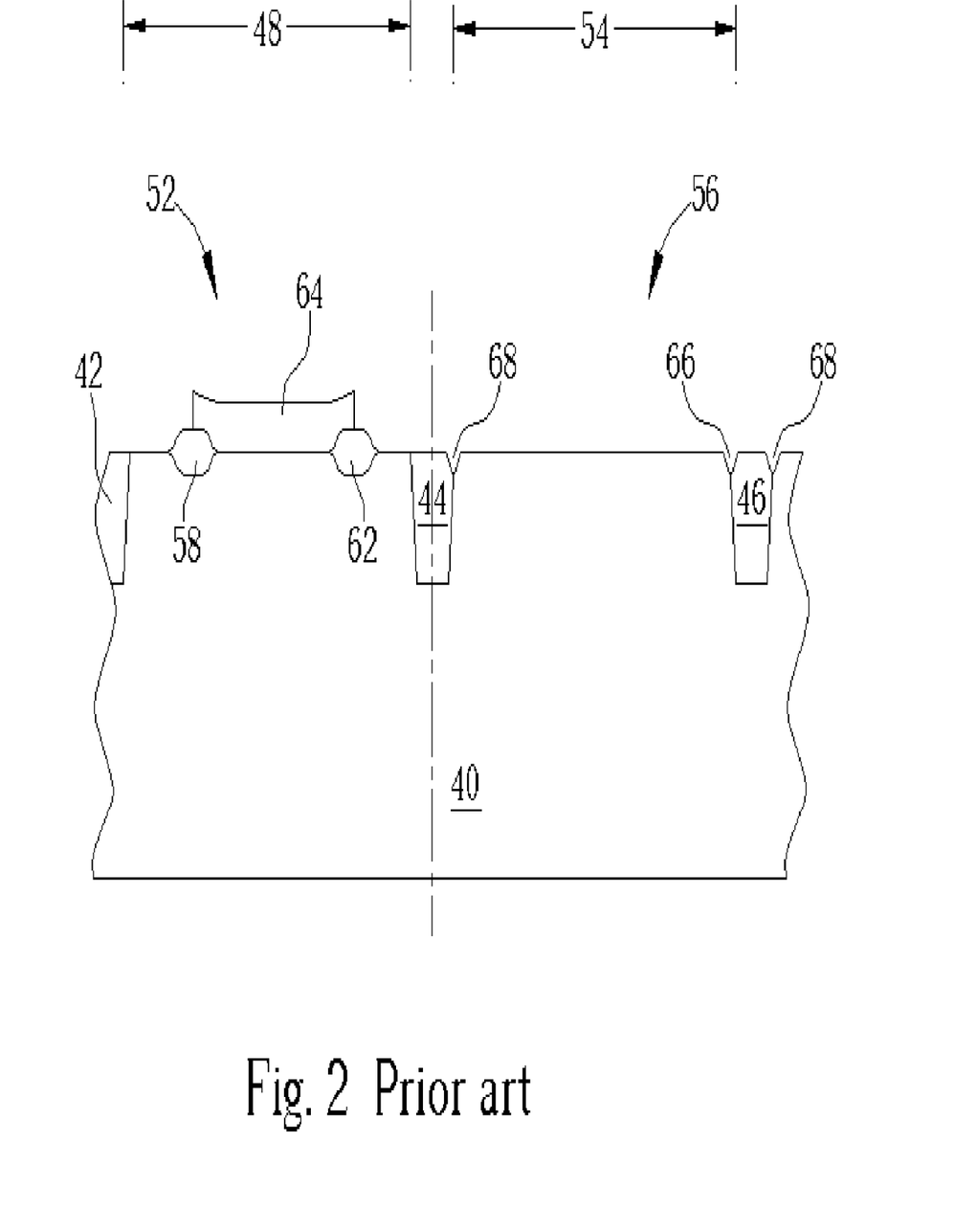
FIG. 2 is a cross-sectional diagram of an HVMOS device and a Submicron device formed on a silicon substrate according to the prior art method.

Please refer to FIG. 2. FIG. 2 is a cross-sectional diagram of an HVMOS device 52 and a Submicron device 56 formed on a silicon substrate according to the prior art method. The HVMOS device 52 and the submicron MOS device 56 are formed on a silicon substrate 40. A shallow trench process is performed first to form a plurality of shallow trenches 42, 44, 46 on the silicon substrate 40. At the same time, at least one active region 48 of the HVMOS device 52 and at least one active region 54 of the Submicron MOS device 56, isolated by shallow trenches 42, 44, 46, are defined on the silicon substrate 40. After that, two not adjacent field oxide layers 58,62 of the HVMOS device 52 are formed on the surface of the active region 48. A thick gate oxide layer (not shown) is thereafter formed on the surface of the silicon substrate 40. Next, portions of the thick gate oxide layer (not shown) not defined as a thick gate oxide region 64 of the HVMOS device 52 is etched and removed to form the thick gate oxide region 64 of the HVMOS device 52.

Because the thick gate oxide layer (not shown) and the shallow trenches 42,44,46 are all made of silicon oxide, divots 66, 68 are formed near the top corner of the shallow trenches 44,46 around the Submicron MOS device 56, when an etching process is performed to the thick gate oxide layer (not shown) of the HVMOS device 52. The divots 66, 68 result in a kink effect that reduces the threshold voltage. In addition, polysilicon may fill in the divots 66, 68 in the subsequent poly gate process to generate a leakage current. It is thus difficult to integrate both HVMOS devices and Submicron MOS devices having small feature sizes on a silicon wafer.

Therefore, it is very important to develop a method of integrating HVMOS devices and Submicron MOS devices having small features on the silicon wafer to avoid the kink effect.

SUMMARY OF INVENTION

It is therefore a primary objective of the claimed invention to provide a method of integrating HVMOS devices and Submicron MOS devices on a silicon substrate with a shallow trench technology to solve the above-mentioned problems.

According to the claimed invention, a method of integrating at least one high voltage metal oxide semiconductor device and at least one Submicron metal oxide semiconductor device on a substrate is provided. The method comprises: providing the substrate, forming a plurality of shallow trenches having different depths on a surface of the substrate, and forming a plurality of silicon oxide layers filling up the shallow trenches, and a top of each of the silicon oxide layers being in the shape of a mushroom.

It is an advantage of the claimed invention to integrate the HVMOS devices and the Submicron MOS devices with a shallow trench technology. Because the size of a shallow trench is easily controlled to fulfill requirements of devices, the integration of the HVMOS devices and the Submicron MOS devices can be achieved by utilizing the shallow trenches having different depths. First, the shallow trenches can replace the two not adjacent field oxide layers to minimize the feature size of drift regions of the HVMOS devices when the shallow trenches are used as the drift shallow trenches. Secondly, the shallow trenches can isolate the HVMOS devices and the Submicron MOS devices when the shallow trenches are used as the isolation shallow trenches. In addition, in order to fabricate the HVMOS devices and the Submicron MOS devices having satisfied performances, the depth of the shallow trenches of the Submicron MOS devices is greater than the depth of the shallow trenches of the HVMOS devices, and the depth of the isolation shallow trenches is greater than the depth of the drift shallow trenches.

Moreover, to form the silicon oxide layers, filling up the shallow trenches, have tops in the shape of a mushroom can effectively avoid the formation of divots, near the top corners of the shallow trenches around the Submicron devices, during the etching process when forming thick gate oxide region of the HVMOS devices. The kink effect is thus avoided to fabricate products having superior performances.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 3:
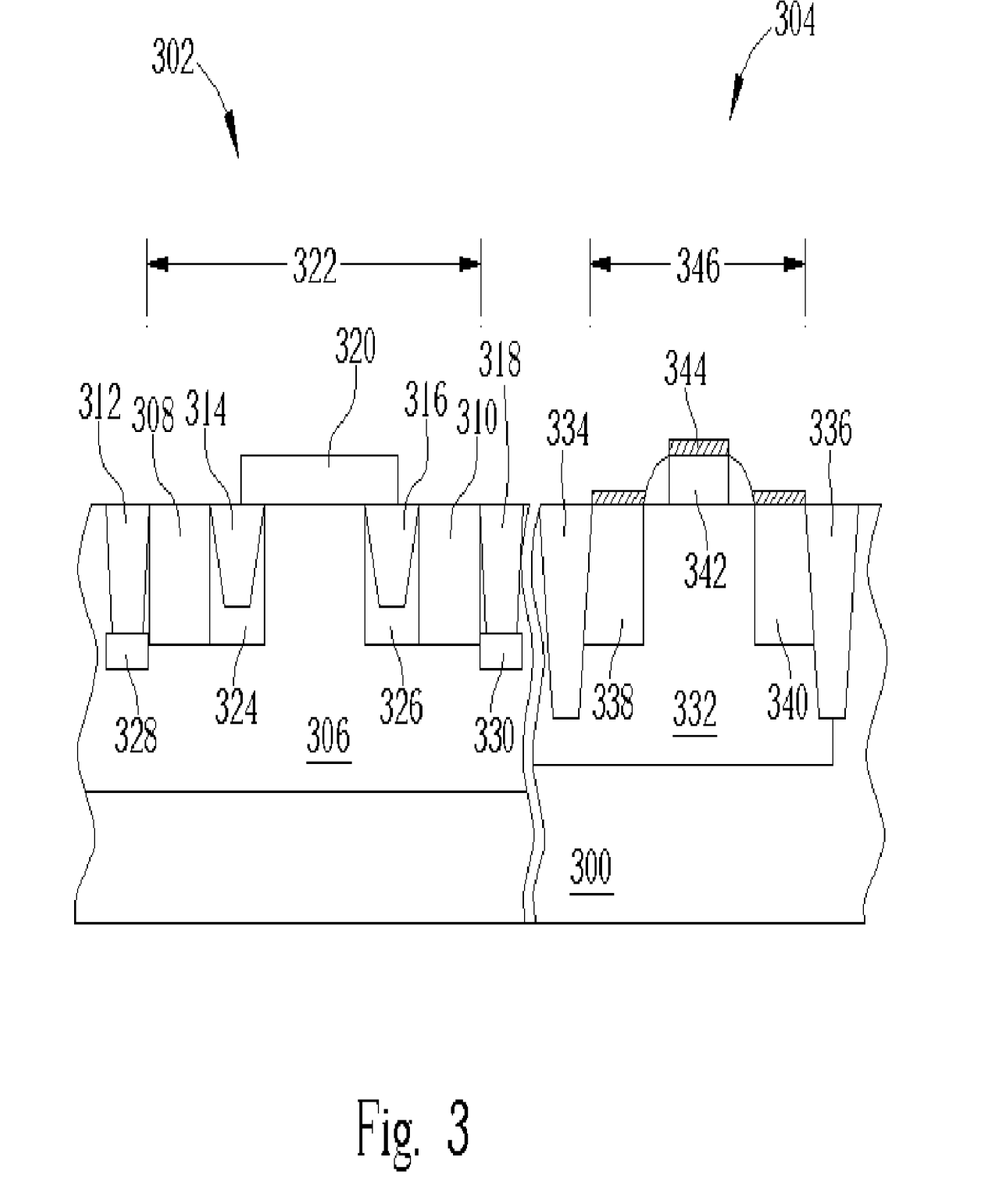
FIG. 3 is a cross-sectional diagram of an HVMOS device and a submicron MOS device formed on a silicon substrate according to the present invention method.

Please refer to FIG. 3. FIG. 3 is a cross-sectional diagram of an HVMOS device 302 and a Submicron MOS device 304 formed on a silicon substrate 300 according to the present invention method. The HVMOS device 302 operates at a voltage level higher than or equal to 24V, and the Submicron MOS device 304 operates at a voltage level less than or equal to 2.5V.

The HVMOS device 302 comprises a first well region 306 of a first conductive type formed on a surface of the silicon substrate 300 of the first conductive type. A plurality of shallow trenches 312,314,316,318, including drift shallow trenches 314,316 and isolation shallow trenches 312,318, are formed on the surface of the silicon substrate 300. A source 308 and a drain 310, both of a second conductive type, are formed on the surface of the silicon substrate 300. A gate 320 is formed on the surface of the silicon substrate 300 between the source region 308 and the drain region 310, with a portion of the gate 320 covering the two not adjacent drift shallow trenches 314,316 in the active region 322. Two drift regions 324,326 of the second conductive type are formed underneath the two drift shallow trenches 314,316. Two isolation regions 328,330 of the second conductive type are formed underneath the two isolation shallow trenches 312,318. The first and second conductive types are opposite to each other.

The Submicron MOS device 304 comprises a well region 332 of the first conductive type formed on the surface of the silicon substrate 300. A plurality of shallow trenches 334, 336 are formed on the surface of the silicon substrate 300. A source region 338 and a drain region 340, both of the second conductive type, as well as a gate 342 are formed on the surface of the silicon substrate 300. The gate 342 is located between the source region 338 and the drain region 340. A salicide layer 344 is formed on a surface of the source region 338, the drain region 340, and the gate 342 in the active region 346.

In the preferred embodiment of the present invention, the first conductive type is P type and the second conductive type is N type, and an N type HVMOS device is formed. Oppositely, if a P type HVMOS device is to be formed, the first conductive type is N type and the second conductive type is P type. Moreover, the depths of the shallow trenches 312,314,316,318 in the HVMOS device 302 and the depth of the shallow trenches 334,336 in Submicron MOS device 304 are different from each other. The depth of the shallow trenches 334,336 of the Submicron MOS device 304 is greater than the depths of shallow trenches 312,314,316,318 of the HVMOS device 302.

Figure 4:
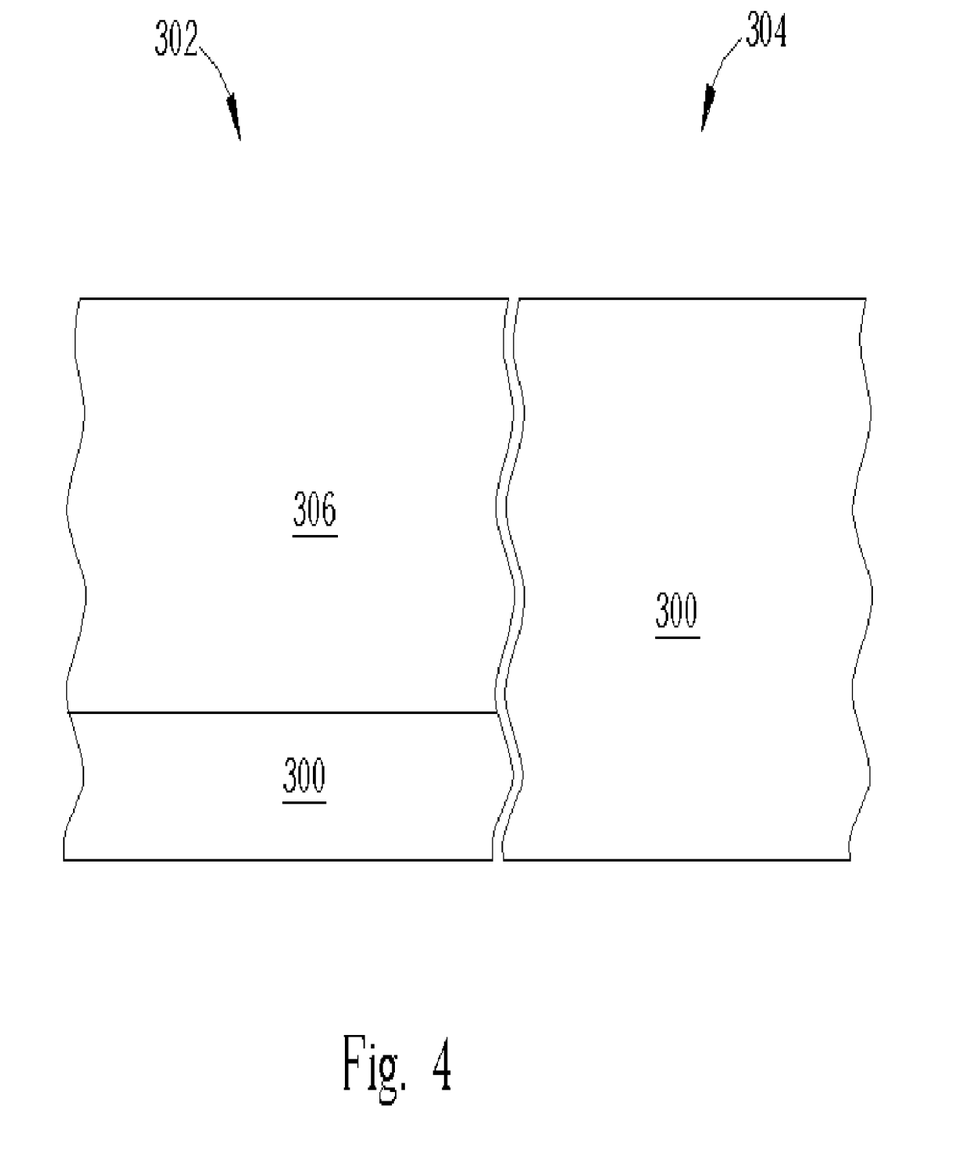
FIG. 4 to FIG. 9 are cross-sectional diagrams illustrating a method for forming the HVMOS device and the Submicron MOS device on the silicon substrate depicted in FIG. 3 according to the present invention.

Please refer to FIG. 4 to FIG. 9. FIG. 4 to FIG. 9 are cross-sectional diagrams illustrating a method for forming the HVMOS device 302 and the Submicron MOS device 304 on the silicon substrate 300 depicted in FIG. 3 according to the present invention. As shown in FIG. 4, a P-type well region 306 of the HVMOS device 302 is formed on the P-type silicon substrate 300 first.

Figure 5:
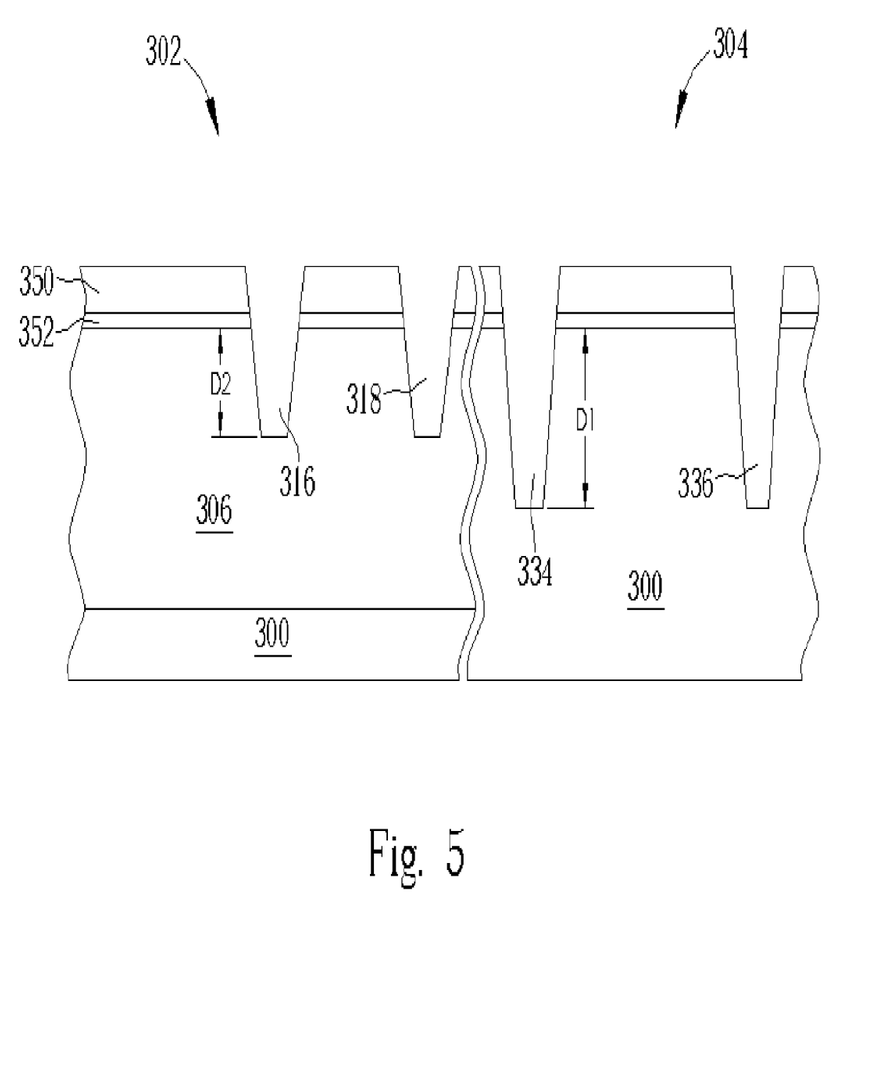

As shown in FIG. 5, a shallow trench process is then performed to form the shallow trenches 316,318,334,336, having different depths, of the HVMOS device 302 and the Submicron device 304. First, a silicon nitride layer 350 is formed on a surface of a pad oxide layer 352, and the pad oxide layer 352 is previously formed on the silicon substrate 300. Then, a first photolithographic process is performed to define a first photoresist layer(not shown), on a surface of the silicon nitride layer 350, by utilizing a first mask. Hard mask patterns (not shown) corresponding to the HVMOS device 302 are thus formed in the first photoresist layer(not shown). The first mask is produced by tooling database of active regions outside the Submicron MOS device 304. A first etching process is thereafter performed to remove the silicon nitride layer 350 not covered by the first photoresist layer(not shown), followed by a second etching process to remove the silicon substrate 300 not covered by the silicon nitride layer 350 to complete the fabrication of the shallow trenches 316,318 of the HVMOS device 302. Finally, the first photoresist layer(not shown) is removed.

Actually, the depth of the shallow trench 316 may be different from the depth of the shallow trench 318. Since the shallow trench 316 is used as a drift shallow trench and the shallow trench 318 is used as an isolation trench, the depth of the shallow trench 318 is greater than the depth of the shallow trench 316 (as shown in FIG. 3). Under the circumstances, the above-mentioned shallow trench process is performed to form the shallow trench 316 or the shallow trench 318 first. Then another shallow trench process is performed to form the shallow trench 318 or the shallow trench 316.

Next, a second photolithographic process is performed to define a second photoresist layer(not shown), on the surface of the silicon nitride layer 350, by utilizing a second mask. Hard mask patterns (not shown) corresponding to the Submicron MOS device 304 are thus formed in the second photoresist layer(not shown). The second mask is produced by tooling database of active regions of the Submicron MOS device 304. After that, a third etching process is performed to remove the silicon nitride layer 350 not covered by the second photoresist layer(not shown), followed by a fourth etching process to remove the silicon substrate 300 not covered by the silicon nitride layer 350 to complete the fabrication of the shallow trenches 334,336 of the submicron MOS device 304. Finally, the second photoresist layer(not shown) is removed. Particularly, the depth D1 of the shallow trenches 334, 336 of the Submicron MOS device 304 is greater than the depth D2 of the shallow trenches 316,318 of the HVMOS device 302. The depth D2 of the shallow trenches 334,336 of the Submicron MOS device 304 is approximately 4000 Å, and the depth D1 of the shallow trenches 316,318 in the HVMOS device 302 is approximately 2500 Å.

Figure 6:
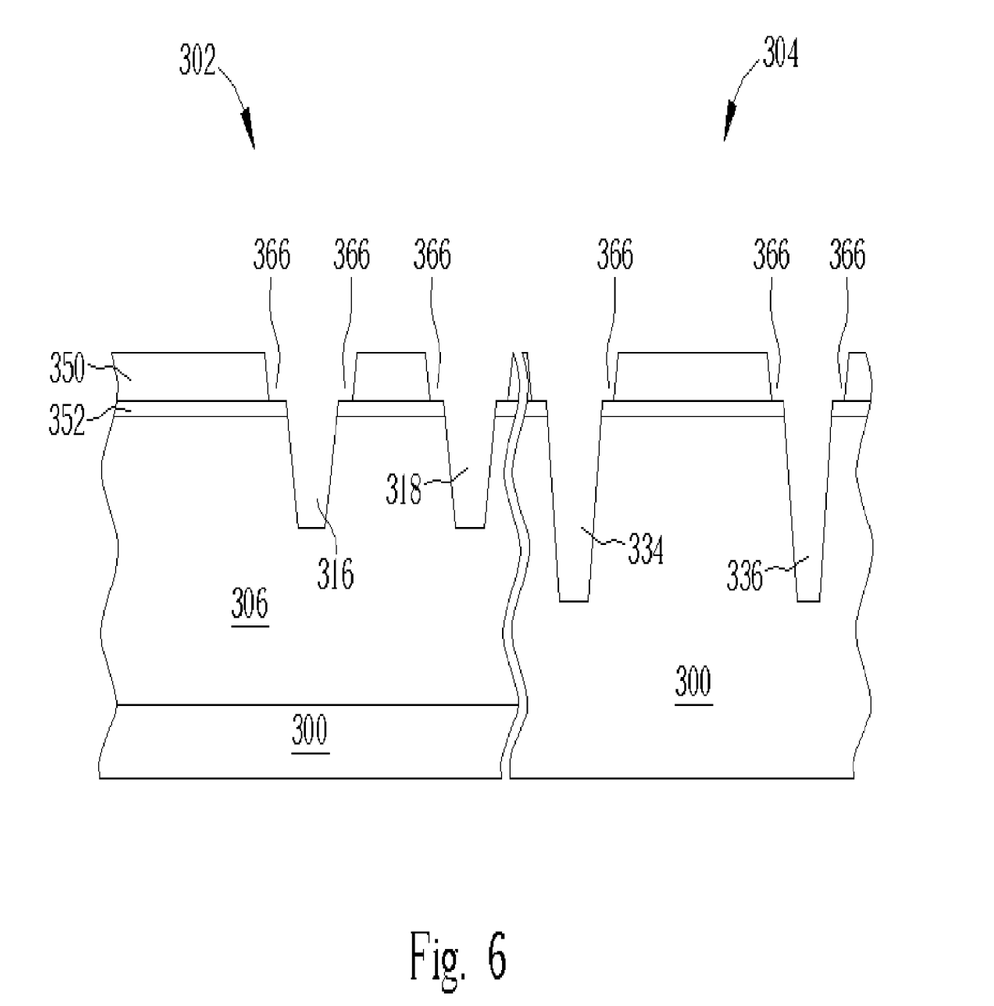

As shown in FIG. 6, a common pullback process is there-after carried out. By performing an isotropic etching process, portions of the silicon nitride layer 350 is removed along an interface of the pad oxide layer 352 and the silicon nitride layer 350 to a thickness of 100–300 angstroms. At least one recess 366 is thus formed and the recess 366 is used for expanding the opening of the silicon nitride layer 350 on top of the shallow trenches 316,318,334,336.

Figure 7:
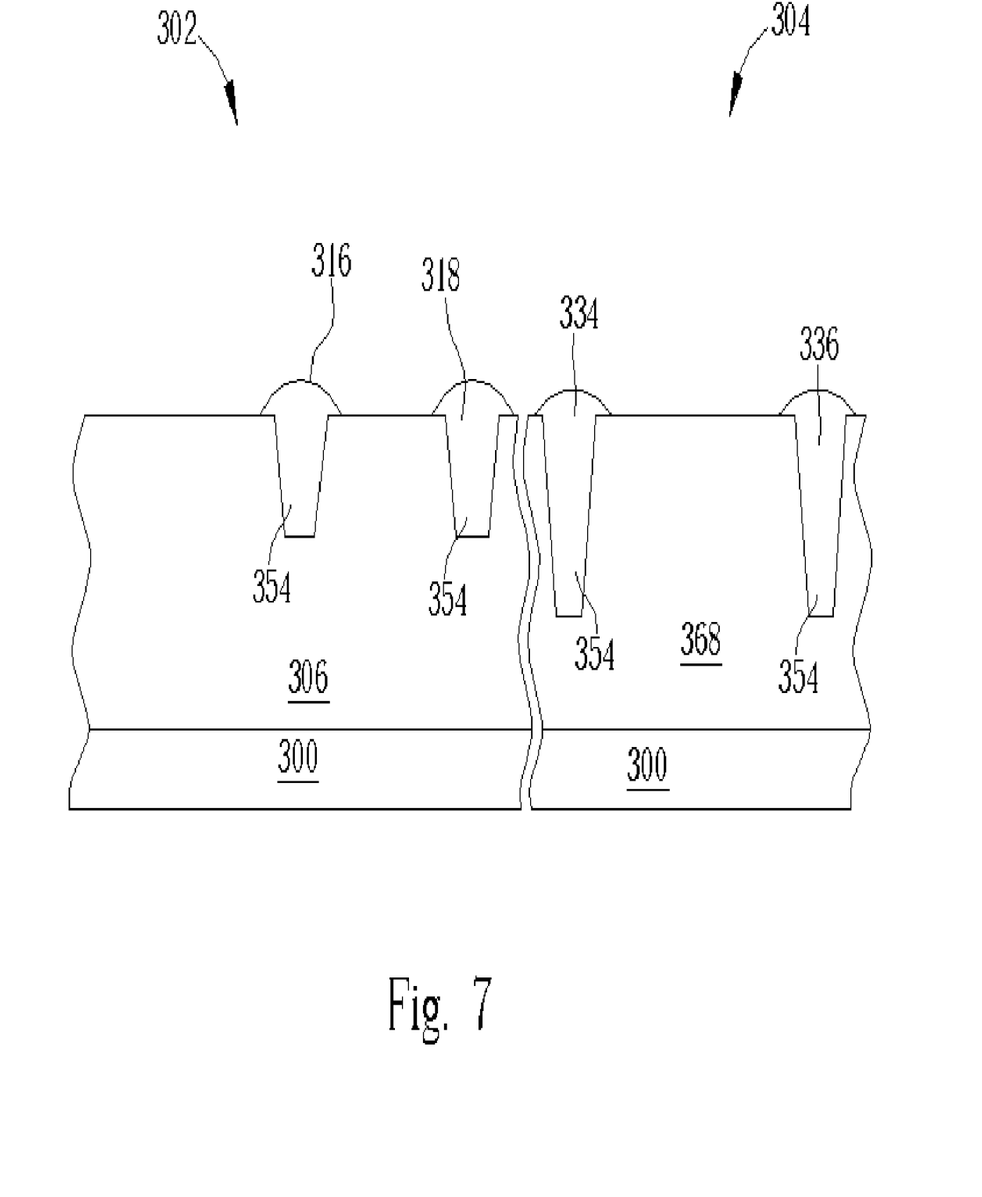

As shown in FIG. 7, at least one silicon oxide layer 354, filling up the shallow trenches 316,318,334,336, has a top in the shape of a mushroom is formed. First, an oxidation process is performed to form a liner oxide layer (not shown) in the inner surface of the shallow trenches 316,318,334, 336, and the linear oxide layer (not shown) functions as a protective layer. Then, an atmospheric pressure chemical vapor deposition (APCVD) process is performed to form a silicon oxide layer 354 filling up the shallow trenches 316,318,334,336 on the silicon substrate 300. Next, a chemical mechanical polishing (CMP) process is performed to remove the silicon oxide layer 354 above the top surface of the silicon nitride layer 350 so that a top surface of the silicon oxide layer 354 is aligned with the top surface of the silicon nitride layer 350 (please refer back to FIG. 6). After that, the silicon nitride layer 350 is removed. Finally, the pad oxide layer (not shown)is removed to result in the top of the silicon oxide layer 354 filling up the shallow trenches 316,318,334,336 presents as a mushroom shape. To make the tops of the silicon oxide layers 354 filling up the shallow trenches 316,318,334,336 in the shape of a mushroom is to protect the shallow trenches 334,336 from forming divots during the etching process when defining the thick gate oxide region of the HVMOS device 302. Then, a P-type well region 368 of the Submicron MOS device 304 is formed.

Figure 8:
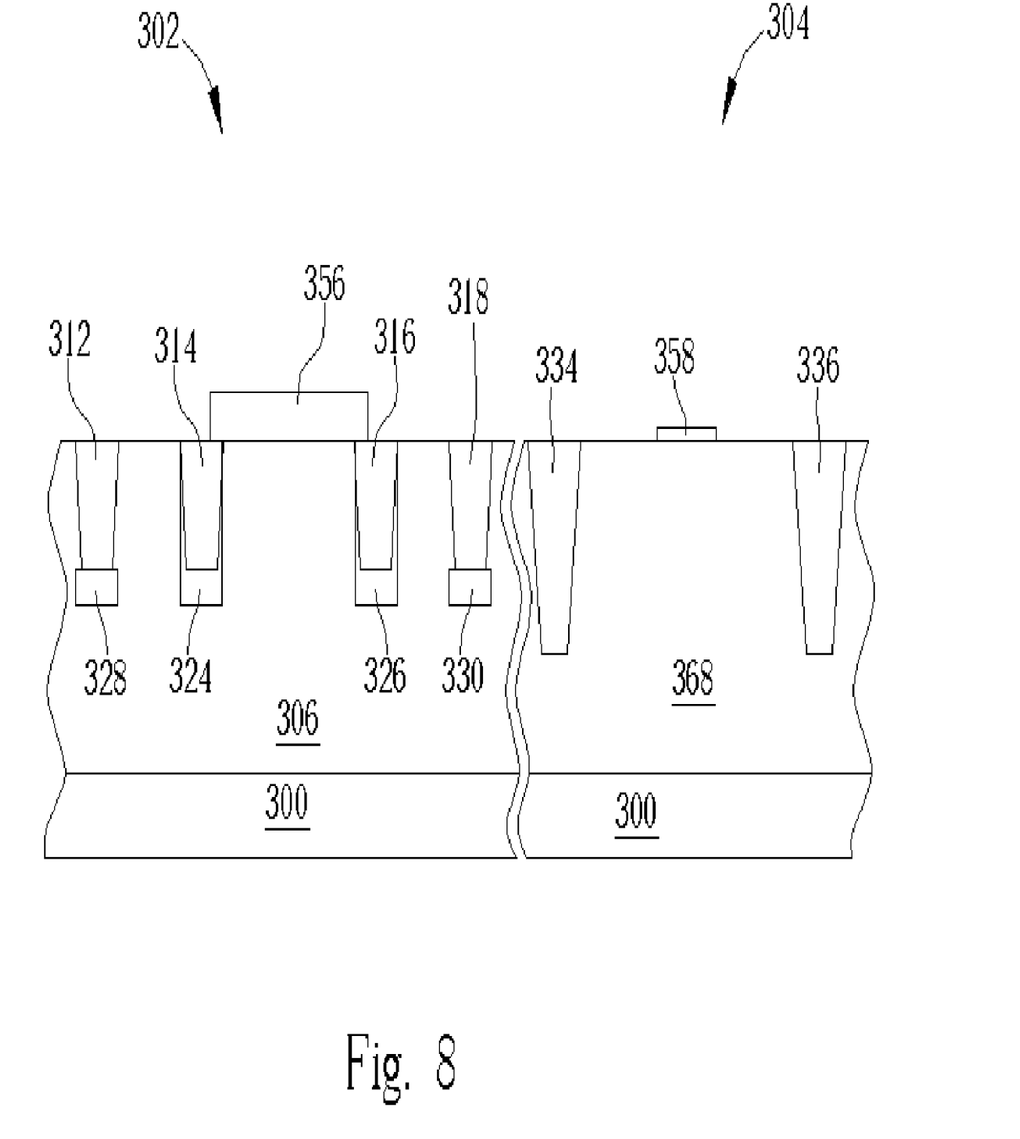

As shown in FIG. 8, gate oxide regions 356,358 having different sizes are respectively formed for the HVMOS device 302 and the Submicron MOS device 304. First, a thick gate oxide layer (not shown) is formed on the silicon substrate 300, and a thickness of the thick gate oxide layer (not shown) is approximately 700 Å. Then, a first drift ion implantation process is performed to form N-type drift regions 324,326 underneath the drift shallow trenches 314, 316 of the HVMOS device 302. Next, a second ion implantation process is performed to form N-type isolation regions 328,330 underneath the isolation shallow trenches 312,318. The isolation regions 328,330 are used for preventing the Submicron MOS device 304 from any impact incurred from the high operation voltage of the HVMOS device 302.

After that, a third photolithographic process is performed to form a third photoresist layer(not shown) on a surface of the thick gate oxide layer (not shown) to define a gate oxide region 356 of the HVMOS device 302. A fifth etching process is thereafter performed to etch the thick gate oxide layer (not shown) not covered by the third photoresist layer (not shown) to form the gate oxide region 356 and followed by removing the third photoresist layer(not shown). Since the tops of the silicon oxide layers 354 that filling up the trenches 334,336 are in a mushroom shape, the shallow trenches 334, 336 are protected during the fifth etching process. As a result, divots near the top corner of the shallow trenches 334,336 of the Submicron MOS device 304 are not formed.

A thin gate oxide region 358 of the Submicron MOS device 304 is thereafter formed. First, a thin gate oxide layer (not shown) is formed on the silicon substrate 300, and a thickness of the thin gate oxide layer (not shown) is approximately 50 Å. Then, a fourth photolithographic process is performed to form a fourth photoresist layer(not shown) on a surface of the thin gate oxide layer (not shown) to define the gate oxide region 358 of the Submicron MOS device 304. Next, a sixth etching process is performed to etch the thin gate oxide layer (not shown) not covered by the photoresist layer (not shown) to form the thin gate oxide region 358 of the Submicron MOS device 304 and followed by removing the fourth photoresist layer(not shown).

Figure 9:
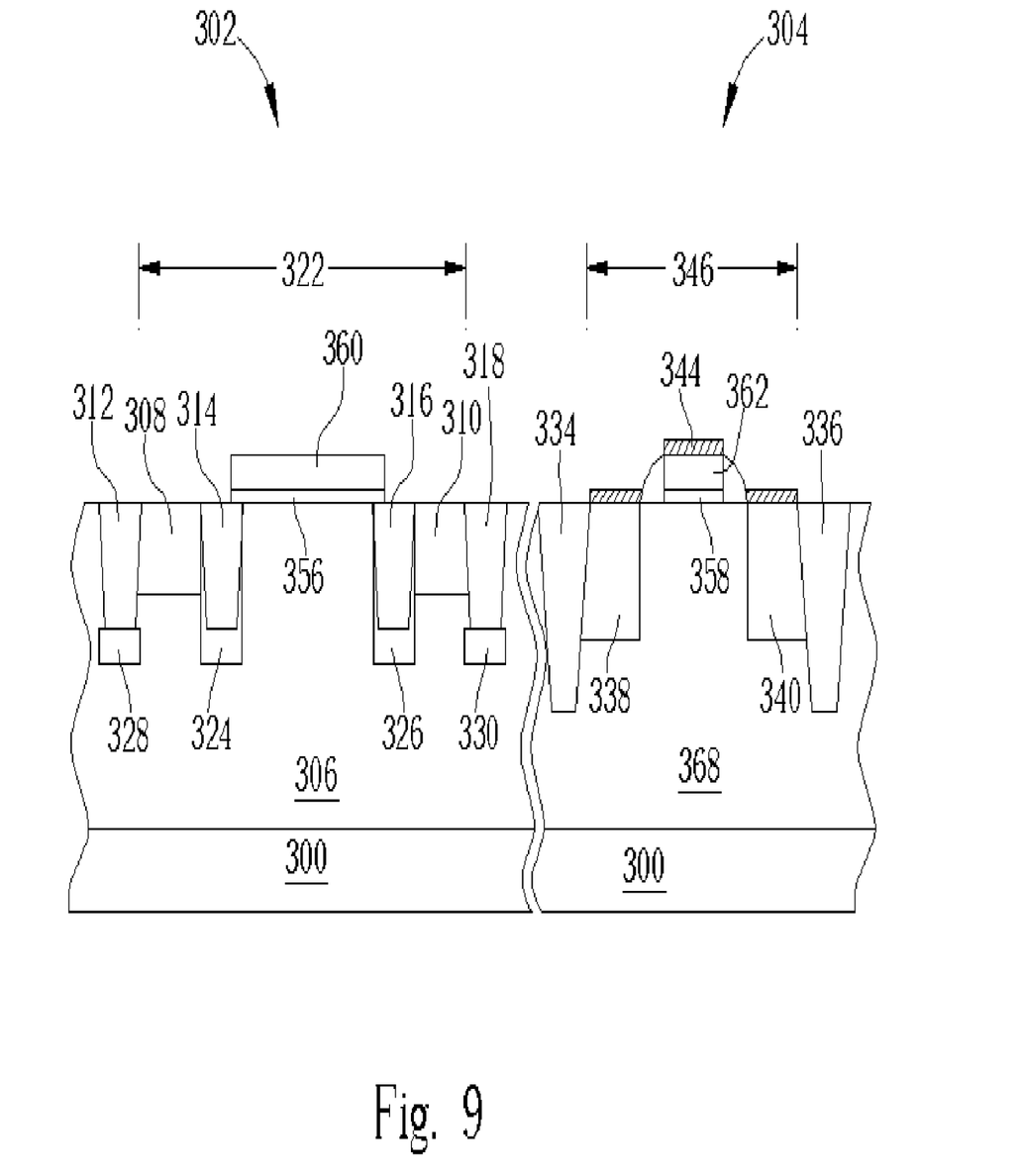

As shown in FIG. 9, poly gate regions 360,362 having different sizes are respectively formed for the HVMOS device 302 and the Submicron MOS device 304. First a polysilicon layer (not shown) is formed on the surface of silicon substrate 300. Then, a fifth photolithographic process is performed to form a fifth photoresist layer(not indicated) on a surface of the polysilicon layer, and a seventh etching process is performed to form a poly gate region 362 of the Submicron MOS device 304 and followed by removing the fifth photoresist layer (not shown). Next, a sixth photolithographic process is performed to form a sixth photoresist layer(not shown) on the surface of the polysiliocn layer (not shown), and an eighth etching process is performed to form a poly gate region 360 of the HVMOS MOS device 302 and followed by removing the sixth photoresist layer (not shown).

It is worth noting that the poly gate region 360 and the poly gate region 362 may be formed in one photolithographic process. The thick gate oxide region 356 and the thin gate oxide region 358 may be simultaneously formed when forming the poly gate region 360 and the poly gate region 362, respectively. In addition, the thin gate oxide layer (not shown) may be retained to skip one photolithographic and one etching processes. Under theses circumstances, the thin gate oxide layer (not shown) underneath the poly gate region 362 is taken as the thin gate oxide region 358.

A third ion implantation process is thereafter performed to form two N-type third ion implantation regions 308,310 on the surface of the active region 322 of the HVMOS MOS device 302. The third ion implantation regions 308,310, being used as double diffuse drains(DDD), function as a source and a drain of the HVMOS MOS device 302. Next, a fourth ion implantation process is performed to form two N-type fourth ion implantation regions 338,340 on the surface of the active region 346 of the Submicron MOS device 304. The fourth ion implantation regions 338,340, being used as double diffuse drains, function as a source and a drain of a Submicron MOS device 304. Finally, a salicide layer 344 is formed on the active region 346 of the submicron MOS device 304.

The present invention method for integrating the HVMOS device and the Submicron MOS device on the silicon substrate with shallow trenches having different depths can not only apply to an HVMOS device operated under + voltage, but also apply to an HVMOS device operated under (+/−) voltage (a +/− HVMOS device). The HVMOS device is operated at +/− voltage higher than/equal to 24V and the Submicron MOS device is operated at less than/equal to 2.5V.

Figure 10:
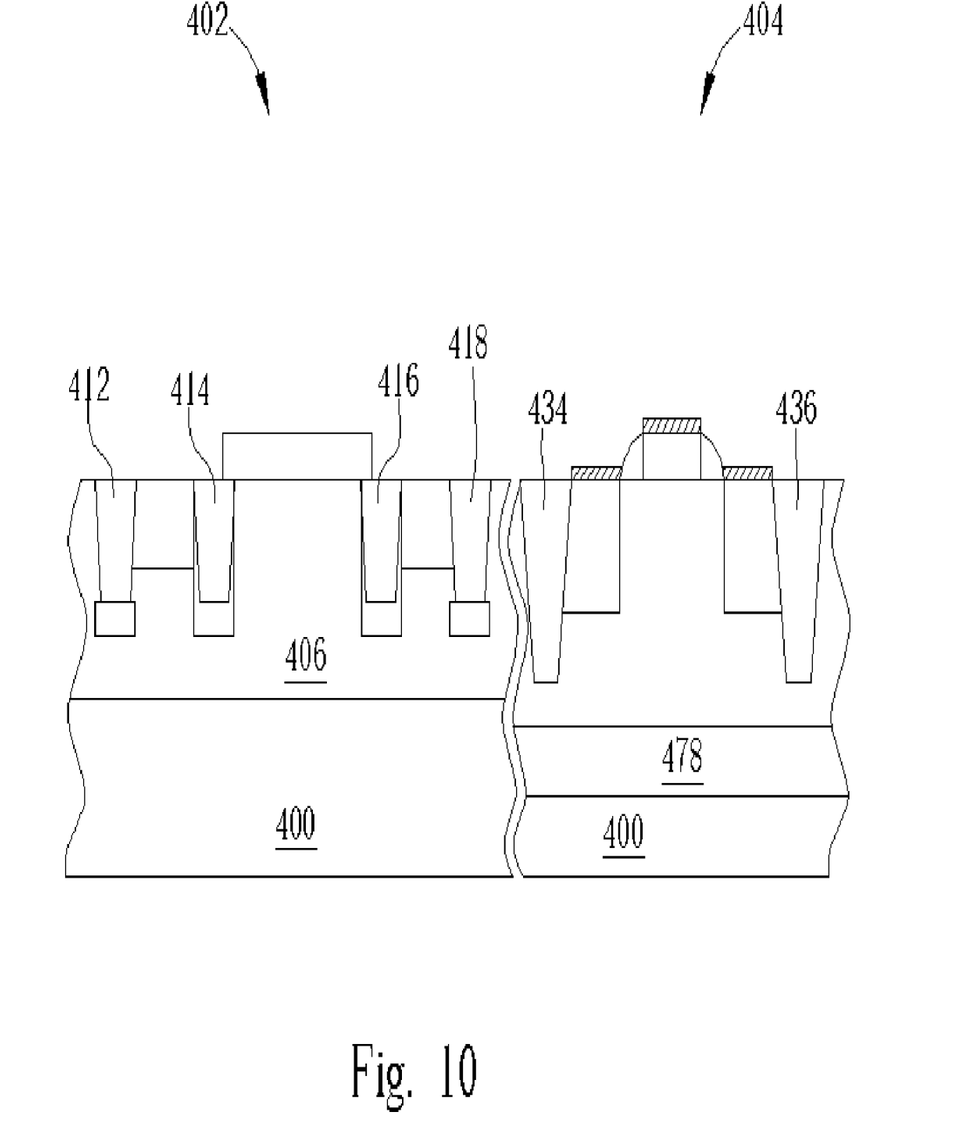
FIG. 10 is a cross-sectional diagram of a (+/−) HVMOS device and a Submicron MOS device formed on a silicon substrate according to the present invention method.

As shown in FIG. 10, FIG. 10 is a cross-sectional diagram of a (+/−) HVMOS device 402 and a Submicron MOS device 404 formed on a silicon substrate 400 according to the present invention method. The only difference between FIG. 10 and FIG. 3 is that one step to form a deep well region of a the Submicrom MOS device 404 having an opposite conductivity conductive type with a conductivity type to the silicon substrate 400 is performed. First, the N-type deep well region 478 of an HVMOS device 302 comprising a well region 306 of a first conductivity type and athe Submicron MOS device 404 is comprising formed, and then a P-type well region 406 of the HVMOS device 402 are all is formed on the P-type silicon substrate 400. 300 The deep well region 478 having the opposite a conductive type to the silicon substrate 400 in order to prevents a back bias effect between anthe HVMOS device 402 and athe Submicron MOS device 404. After that, a plurality of shallow trenches 412,414,416,418,434,436 are formed and all the subsequent steps are the same as those previously described in FIG. 4 to FIG. 9.

In contrast to the prior art method, the present invention method integrates the HVMOS devices and the Submicron MOS devices with the shallow trenches having different depths. Not only are the drift regions formed underneath the two not adjacent shallow trenches in the active region of the HVMOS devices, but also the shallow trenches are used for isolating the HVMOS devices and the Submicron devices. Therefore, the present invention can simultaneously form a large number of both the HVMOS devices and the Submicron MOS devices on the silicon substrate without resulting in the kink effect.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of integrating at least one high voltage metal oxide semiconductor (HVMOS) device and at least one Submicron metal oxide semiconductor (Submicron MOS) device on a substrate comprising:
   providing the substrate;
   forming a plurality of shallow trenches having different depths on a surface of the substrate, the shallow trenches comprising drift shallow trenches and isolation shallow trenches;
   forming a plurality of silicon oxide layers filling up the shallow trenches, a top of each of the silicon oxide layers being in the shape of a mushroom; and
   forming two isolation ion implantation regions underneath the isolation shallow trenches to isolate the high voltage metal oxide semiconductor device and the Submicron metal oxide semiconductor device.

2. The method of claim 1 wherein a depth of the shallow trenches of the Submicron metal oxide semiconductor device is greater than a depth of the shallow trenches of the high voltage metal oxide semiconductor device.

3. The method of claim 1 wherein a depth of the isolation shallow trenches is greater than a depth of the drift shallow trenches.

4. The method of claim 1 wherein two drift ion implantation regions are formed underneath the drift shallow trenches in an active region of the high voltage metal oxide semiconductor device.

5. The method of claim 1 wherein to form a plurality of shallow trenches having different depths comprises the following steps:
   forming a pad oxide layer on the surface of the substrate;
   forming a silicon nitride layer on a surface of the pad oxide layer;
   forming a first hard mask patterns on a surface of the silicon nitride layer;
   performing a first etching process to remove portions of the silicon nitride layer and the substrate not covered by the first hard mask patterns to form a plurality of shallow trenches of the high voltage metal oxide semiconductor device;
   forming a second hard mask patterns on the surface of the silicon nitride layer; and
   performing a second etching process to remove portions of the silicon nitride layer and the substrate not covered by the second hard mask patterns to form a plurality of shallow trenches of the Submicron metal oxide semiconductor device.

6. The method of claim 5 wherein the first hard mask patterns are defined by a first mask produced by tooling database of at least one active region outside the Submicron metal oxide semiconductor device.

7. The method of claim 5 wherein the second hard mask patterns are defined by a second mask produced by tooling database of at least one active region of the Submicron metal oxide semiconductor device.

8. The method of claim 5 wherein to form a plurality of silicon oxide layers having the tops in the shape of a mushroom comprises the following steps:
   performing an isotropic etching process to remove portions of the silicon nitride layer along an interface of the pad oxide layer and the silicon nitride layer;
   forming a silicon oxide layer on the surface of the substrate, and the silicon oxide layer filling up the shallow trenches;
   performing a chemical mechanical polishing (CMP) process to remove the silicon oxide layer above a top surface of the silicon nitride layer so that a top surface of the silicon oxide layer is aligned with the top surface of the silicon nitride layer; and
   removing the silicon nitride layer.

9. The method of claim 8 further comprising a step for forming a linear oxide layer in an inner surface of the shallow trenches after performing the isotropic etching process.

10. The method of claim 8 wherein a thickness of the silicon nitride layer removed by the isotropic etching process is 100 to 300 Å.

11. The method of claim 8 wherein the silicon oxide layer is formed by performing an atmospheric pressure chemical vapor deposition (APCVD) process.

12. A method of integrating at least one high voltage metal oxide semiconductor (HVMOS) device and at least one Submicron metal oxide semiconductor (Submicron MOS) device on a substrate comprising:
   providing the substrate of a first conductive type;
   forming a deep well region of the Submicron metal oxide semiconductor device of a second conductive type;
   forming a plurality of shallow trenches having different depths on a surface the substrate, the shallow trenches comprising drift shallow trenches and isolation shallow trenches;
   forming a plurality of silicon oxide layers filling up the shallow trenches, a top of each of the silicon oxide layers being in the shape of a mushroom; and
   forming two isolation ion implantation regions underneath the isolation shallow trenches to isolate the high voltage metal oxide semiconductor device and the Submicron metal oxide semiconductor device.

13. The method of claim 12 wherein the first conductive type and the second conductive type are opposite to each other.

14. The method of claim 13 wherein the first conductive type is P type, and the second conductive type is N type.

15. The method of claim 13 wherein the first conductive type is N type and the second conductive type is P type.

16. The method of claim 12 wherein a depth of the shallow trenches of the Submicron metal oxide semiconductor device is greater than a depth of the shallow trenches of the high voltage metal oxide semiconductor device.

17. The method of claim 15 wherein a depth of the isolation shallow trenches is greater than a depth of the drift shallow trenches.

18. The method of claim 15 wherein two drift ion implantation regions are formed underneath die drift shallow trenches in an active region of the high voltage metal oxide semiconductor device.

19. The method of claim 12 wherein to form a plurality of shallow trenches having different depths comprises the following steps:
   forming a pad oxide layer on the surface of the substrate;
   forming a silicon nitride layer on a surface of the pad oxide layer;
   forming a first hard mask patterns on a surface of the silicon nitride layer;
   performing a first etching process to remove portions of the silicon nitride layer and the substrate not covered by the first hard mask patterns to form a plurality of shallow trenches of the high voltage metal oxide semiconductor device;
   forming a second hard mask patterns on the surface of the silicon nitride layer; and
   performing a second etching process to remove portions of the silicon nitride layer and the substrate not covered by the second hard mask patterns to form a plurality of shallow trenches of the Submicron metal oxide semiconductor device.

20. The method of claim 19 wherein the first hard mask patterns are defined by a first mask produced by tooling database of at least one active region outside the Submicron metal oxide semiconductor device.

21. The method of claim 19 wherein the second hard mask patterns are defined by a second mask produced by tooling database of at least one active region of the Submicron metal oxide semiconductor device.

22. The method of claim 19 wherein to form a plurality of silicon oxide layers having the tops in the shape of a mushroom comprises the following steps:
   performing an isotropic etching process to remove portions of the silicon nitride layer along an interface of the pad oxide layer and the silicon nitride layer;
   forming a silicon oxide layer on the surface of the substrate, and the silicon oxide layer falling up the shallow trenches;
   performing a chemical mechanical polishing (CMP) process to remove the silicon oxide layer above a top surface of the silicon nitride layer so that a top surface of the silicon oxide layer is aligned with the top surface of the silicon nitride layer; and
   removing the silicon nitride layer.

23. The method of claim 22 further comprising a step for forming a linear oxide layer in an inner surface of the shallow trenches after performing the isotropic etching process.

24. The method of claim 22 wherein a thickness of the silicon nitride layer removed by the isotropic etching process is 100 to 300 Å.

25. The method of claim 22 wherein the silicon oxide layer is formed by performing an atmospheric pressure chemical vapor deposition (APCVD) process.

* * * * *